(12) United States Patent
Takada

(10) Patent No.: US 7,314,841 B2
(45) Date of Patent: Jan. 1, 2008

(54) PORCELAIN COMPOSITION

(75) Inventor: Takahiro Takada, Otsu (JP)

(73) Assignee: Murata Manufacturing Co., Ltd. (JP)

( * ) Notice: Subject to any disclaimer, the term of this patent is extended or adjusted under 35 U.S.C. 154(b) by 100 days.

(21) Appl. No.: 10/558,154

(22) PCT Filed: May 14, 2004

(86) PCT No.: PCT/JP2004/006922

§ 371 (c)(1),
(2), (4) Date: Nov. 23, 2005

(87) PCT Pub. No.: WO2004/103931

PCT Pub. Date: Dec. 2, 2004

(65) Prior Publication Data

US 2006/0247118 A1    Nov. 2, 2006

(30) Foreign Application Priority Data

May 26, 2003   (JP)  .............................. 2003-147221

(51) Int. Cl.
C03C 14/00     (2006.01)
C03C 3/15      (2006.01)
C03C 3/155     (2006.01)

(52) U.S. Cl. .............................. 501/32; 501/50; 501/51
(58) Field of Classification Search .................. 501/32, 501/50, 51

See application file for complete search history.

(56) References Cited

U.S. PATENT DOCUMENTS 4,621,066 A    11/1986  Nishigaki et al.
6,147,019 A *  11/2000  Donohue ...................... 501/50
6,217,821 B1 *  4/2001  Donohue ..................... 264/619
6,281,151 B1 *  8/2001  Tick ............................... 501/3

FOREIGN PATENT DOCUMENTS

| JP | 60-260465 |   | 12/1985 |
| JP | 6-56462   |   | 3/1994  |
| JP | 8-217484  |   | 8/1996  |
| JP | 8-277123  |   | 10/1996 |
| JP | 09-315855 | * | 12/1997 |
| JP | 9-315855  |   | 12/1997 |
| JP | 200410437 | * | 1/2004  |
| JP | 7-187705  |   | 7/2005  |
| WO | WO99/05071|   | 2/1999  |

OTHER PUBLICATIONS

Japanese Journal of Applied Physics vol. 44, No. 9A, 2005, pp. 6629-6635.
Japanese Journal of Applied Physics vol. 42 (2003) pp. 6162-6167, Part 1, No. 9B, Sep. 2003.

* cited by examiner

*Primary Examiner*—Karl Group
(74) *Attorney, Agent, or Firm*—Dickstein, Shapiro, LLP

(57) ABSTRACT

A ceramic composition includes a glass composition and a filler including at least one of $Al_2O_3$ and $TiO_2$, wherein the composition of the ceramic composition includes 0.15 to 0.55 mol of a, 0.45 to 0.85 mol of b, 0.01 to 0.2 mol of an oxide RO of an alkaline earth metal element R, and 0.1 to 0.4 mol of the filler, wherein a represents a molar quantity of an oxide $Ln_2O_3$ of a rare earth element Ln, b represents a molar quantity of boron oxide $B_2O_3$, and a+b=1 mol.

21 Claims, No Drawings

PORCELAIN COMPOSITION

TECHNICAL FIELD

The present invention relates to ceramic compositions. In particular, it relates to a ceramic composition usable as, for example, a material for a multilayer substrate used for propagation of signals in a high-frequency band.

BACKGROUND ART

Recent years saw development in high-speed, large-capacity data communications and cellular communications. With respect to multilayer substrates having integrated circuits, this development led to not only size-reduction and increased density but also investigations as to use of signals having frequencies in a high-frequency band ranging from, for example, several ten megahertz to several hundred gigahertz. While ceramic compositions are used in these multilayer substrates, it is desirable that the ceramic compositions be made of a material (high-frequency band material) compatible with signals in the high-frequency band.

Typically, alumina ($Al_2O_3$) has been primarily used as the ceramic composition for the high-frequency band. As the density of the integrated circuits increases, there has been developed a process of making a multilayer substrate including an integrated circuit, the process including stacking a plurality of green sheets composed of unsintered $Al_2O_3$, each green sheet having a conductor paste that contains a material for metal wiring applied by printing, and then simultaneously baking the green sheets and the conductor paste. Since $Al_2O_3$ sinters at a temperature as high as 1,500° C. to 1,600° C., a high melting point-metal, such as tungsten or molybdenum, which can withstand such a high temperature, has been required as the material for the metal wiring of the integrated circuit.

The multilayer substrate has a problem in that it requires a large amount of energy since the sintering temperature is high, thereby increasing the manufacturing cost. Since the thermal expansion coefficient of $Al_2O_3$ is larger than that of the IC chip, such as a silicon chip, in the integrated circuit, the multilayer substrate may suffer from cracks depending on the operating temperature of the multilayer substrate. Furthermore, since the relative dielectric constant of $Al_2O_3$ is large, the rate of signal propagation in the integrated circuit has been low. Since the specific resistance of a high melting point-metal, such as tungsten or molybdenum, is large compared to that of Cu or Ag, which is suitable as a material for the metal wiring, the conductor loss due to the resistance of the metal wiring itself has also been large.

In view of the above, various ceramic compositions each in which a filler is incorporated in a glass composition have been developed as the material for multilayer substrates. Multilayer substrates using such ceramic compositions can be sintered at a temperature lower than that when $Al_2O_3$ is used. Thus, it becomes possible to simultaneously sinter the ceramic compositions and the material for metal wiring, such as Cu or Ag, having a smaller specific resistance. Furthermore, since the filler is contained in the glass composition, the change in shape of the ceramic composition can be reduced, and the strength of the ceramic composition can be increased.

For example, Japanese Examined Patent Application Publication No. 3-53269 described an example of such a ceramic composition, prepared by sintering a mixture of a $CaO$—$SiO_2$—$Al_2O_3$—$B_2O_3$ glass composition and 50 to 35 mass % of $Al_2O_3$ as a filler at 800° C. to 1,000° C. Japanese Patent No. 3277169 discloses a ceramic composition containing 0 to 10 mol % of $Al_2O_3$ as a filler and a glass composition including 50 to 67 mol % of $B_2O_3$, 2 to 3 mol % of an oxide of an alkali metal element, 20 to 50 mol % of an oxide of an alkaline earth metal element, and 2 to 15 mol % of an oxide of a rare earth element. Japanese Unexamined Patent Application Publication No. 9-315855 discloses a ceramic composition containing an oxide of a rare earth element, $Al_2O_3$, CaO, and $TiO_2$, and in which the compounding ratio of these components is limited within a particular range.

The performances required for the ceramic composition for the high-frequency band include a low dielectric loss $\tan\delta$ in the high-frequency band and a small absolute value of the temperature coefficient $\tau_f$ of the resonant frequency.

In other words, the loss in the course of signal propagation in the high-frequency band is preferably as small as possible. Thus, it is desirable that the dielectric loss $\tan\delta$ of the ceramic composition in the high-frequency band be small, i.e., that the Q value ($1/\tan\delta$) be large. Moreover, in order to yield stable performance from the ceramic composition serving as a dielectric member despite a temperature change, it is desirable that the absolute value of the temperature coefficient $\tau_f$ of the resonant frequency be small, i.e., that the temperature dependence of the resonant frequency be low.

DISCLOSURE OF INVENTION

Under the above-described circumstances, an object of the present invention is to provide a ceramic composition that can be sintered at a low temperature and has a small dielectric loss in the high-frequency band and a low temperature dependence of the resonant frequency.

An aspect of the present invention provides a ceramic composition including a glass composition and a filler incorporated in the glass composition, the filler including at least one of $Al_2O_3$ and $TiO_2$, wherein the composition of the ceramic composition includes 0.15 to 0.55 mol of a, 0.45 to 0.85 mol of b, 0.01 to 0.2 mol of an oxide RO of an alkaline earth metal element R, and 0.1 to 0.4 mol of the filler, wherein a represents a molar quantity of an oxide $Ln_2O_3$ of a rare earth element Ln, b represents a molar quantity of boron oxide $B_2O_3$, and a+b=1 mol.

Preferably, the ceramic composition includes 0.05 mol or less of tungsten oxide $WO_3$, wherein a represents a molar quantity of an oxide $Ln_2O_3$ of a rare earth element Ln, b represents a molar quantity of boron oxide $B_2O_3$, and a+b=1 mol.

Preferably, the ceramic composition includes 0.0005 to 0.002 mol of an oxide $M_2O$ of an alkali metal element M, wherein a represents a molar quantity of an oxide $Ln_2O_3$ of a rare earth element Ln, b represents a molar quantity of boron oxide $B_2O_3$, and a+b=1 mol.

BEST MODE FOR CARRYING OUT THE INVENTION

The present inventor has conducted various studies on the composition in order to obtain a ceramic composition that can be sintered at a low temperature and has a small dielectric loss in the high-frequency band and a low temperature dependence of the resonant frequency.

It has been found that a ceramic composition in which a filler composed of an inorganic oxide is incorporated in a glass composition is most suitable as such a ceramic composition. The internal structure of the ceramic composition is a network structure composed of a glass composition filling the gaps between the respective particles of the filler. Since the material usable as the filler is limited within a certain range, the characteristics of the glass composition must be improved to further improve the performance.

Thus, the material for the glass composition was studied first. In particular, the sintering temperature of the glass composition, the compatibility with the filler, the relative dielectric constant, the dielectric loss in the high-frequency band, and the temperature dependence of the resonant frequency were investigated. Of these items, the dielectric characteristic was measured by a dielectric resonator method (short-circuited at both ends of a dielectric resonator), i.e., Hakki & Coleman method, using a cylindrical test sample after sintering.

In general, the dielectric loss is evaluated in terms of Q value, which is obtained by the sharpness of the resonance. The Q value is frequency-dependent and decreases in proportion to the frequency. In contrast, the resonant frequency changes with the shape and the dielectric constant of the test sample. Thus, the dielectric loss of the ceramic composition is evaluated by comparative assessment in terms of the product fQ of the resonant frequency fo and Q.

As a result of the studies on various glass compositions, it has been found that a glass composition containing a large amount of crystals obtained by mixing an oxide $Ln_2O_3$ of a rare earth element (also referred to as "Ln") and boron oxide $B_2O_3$ exhibits a particularly low dielectric loss. In this glass composition, crystals of $LnBO_3$, $LnB_3O_6$, $Ln_3BO_3$, or $Ln_4B_2O_9$ appear depending on the compounding ratio, and the phase of these crystals presumably decreases the dielectric loss.

However, in order to adjust the composition of the glass composition composed of only two components, i.e., $Ln_2O_3$ and $B_2O_3$, to yield a low dielectric loss, the melting temperature must be increased, and thus, the sintering temperature required for obtaining a dense sinter becomes high. It was found that by adding an adequate amount of an oxide RO of an alkaline earth metal element R (wherein R represents at least one of Mg, Ca, Sr and Ba) to the composition composed of $Ln_2O_3$ and $B_2O_3$, the sintering temperature can be decreased without significantly affecting the dielectric loss.

Here, the target performance of the ceramic composition is set as follows: that the value fQ (fo [GHz]×Q) at around 10 GHz is 15,000 or higher; that the change in resonant frequency with temperature is small; and that the composition can be sintered at a temperature as low as 1,000° C. or less, which is the temperature at which metal wiring composed of a highly conductive material, Ag or Cu, can be simultaneously formed to produce a multilayer substrate. The investigations on the composition of the ceramic composition were carried out based these. That the change in resonant frequency with temperature be small is important for the stable operation of the integrated circuit. The resonant frequency was measured while varying the temperature, and the rate of change in resonant frequency (temperature characteristic $\tau_f$) with the varying temperature was evaluated. The target range of the temperature characteristic $\tau_f$ of the resonant frequency was set to within ±50 ppm/° C. ($-50$ ppm/° C.$\leq \tau_f \leq +50$ ppm/° C.).

It was also found that incorporation of tungsten oxide, $WO_3$, was effective for decreasing the sintering temperature. It was found that when an excessively large amount of $WO_3$ was incorporated, the change in resonant frequency with temperature tended to shift toward the negative side.

It was found that incorporation of a small amount of an oxide $M_2O$ of an alkali metal element M (wherein M represents at least one selected from Li, Na, and K) can further decrease the sintering temperature. In particular, incorporation of $M_2O$ can effectively decrease the sintering temperature when a process of mixing all the starting materials and then sintering the resulting mixture in one step to obtain a ceramic composition is employed.

The filler is important for maintaining the strength of the ceramic composition and the shape during the sintering. Here, one or both of $Al_2O_3$ and $TiO_2$ are used as the filler. When the strength is desired, $Al_2O_3$ is primarily used whereas $TiO_2$ is primarily used when a large dielectric constant is desired. However, when the amount of filler is excessively large, the sintering temperature must be increased. When the amount of the filler is excessively small, the strength and the shape can no longer be maintained. Thus, the amount of the filler is limited by these factors.

The present invention has been made based on these results of studies by specifically setting the limit of the composition range of the ceramic composition. The ceramic composition of the present invention includes a glass composition and a filler contained in the glass composition and is sintered at a low temperature. The reasons for limiting the amount of each component of the composition are as follows.

Where the content of the oxide $Ln_2O_3$ of the rare earth element Ln in the ceramic composition of the present invention is represented by a, the content of the boron oxide $B_2O_3$ in the ceramic composition of the present invention is represented by b, and a+b=1 mol, a is 0.15 to 0.55 mol and b is 0.45 to 0.85 mol.

These content ranges are necessary for decreasing the dielectric loss in the high-frequency band and for performing low-temperature sintering. When the contents of $Ln_2O_3$ and $B_2O_3$ are set as above, excellent dielectric characteristic, i.e., a high fQ value, can be yielded by the generation of crystals represented by $Ln_xB_yO_z$ (wherein x, y, and z each represent an integer). In other words, where a+b=1 mol and a is less than 0.15 and b is more than 0.85, $B_2O_3$ that cannot form $Ln_xB_yO_z$ enters a liquid phase, thereby increasing the glass phase. Thus, the dielectric loss cannot be decreased. Where a+b=1 mol and a is more than 0.55 and b is less than 0.45, the sintering temperature increases, and a ceramic composition composed of a dense sinter cannot be obtained by the target low-temperature sintering.

Note that any of the rare earth elements represented by Ln can increase the fQ value. Thus, in this invention, one or more rare earth elements can be selected. In particular, when La and/or Nd is used as the rare earth element, an fQ value higher than that achieved by other rare earth elements can be obtained. However, the sintering temperature and the dielectric constant of the ceramic composition differ depending on the type of rare earth element. Thus, these properties may be adequately adjusted by changing the type of the rare earth element or by changing the content of the oxide RO of the alkaline earth metal element R described below.

The content of the each component described below is indicated in terms of a molar ratio with respect to one mole of the total of $Ln_2O_3$ and $B_2O_3$.

The content of the oxide RO of the alkaline earth metal element R is 0.01 to 0.2 mol. At an RO content less than 0.01 mol, the sintering temperature cannot be decreased. At an RO content exceeding 0.2 mol, the temperature characteristic $\tau_f$ of the resonant frequency becomes lower than $-50$ ppm/° C., i.e., excessively shifted toward the negative side, thereby increasing the temperature dependence.

At least one of MgO, CaO, SrO, and BaO may be used as the oxide RO of the alkaline earth metal R. In particular, the fQ value tends to be larger with CaO compared to that with oxides of other alkaline earth metals.

Preferably, tungsten oxide $WO_3$ is contained in the ceramic composition of the present invention. When $WO_3$ is contained, a dense sinter can be obtained by low-temperature sintering, which is the target of the present invention, while increasing the fQ value. In order to achieve such an effect, $WO_3$ is preferably contained in an amount of 0.05 mol or less and more preferably in an amount of 0.005 to 0.05 mol. At a $WO_3$ content exceeding 0.05 mol, the fQ value decreases, and the temperature characteristic $\tau_f$ of the resonant frequency tends to significantly shift toward the negative side. When the $WO_3$ content is less than 0.005 mol, the above-described effect is not easily achieved. In the present invention, $WO_3$ is not an essential component.

The ceramic composition of the present invention preferably contains 0.0005 to 0.002 mol of an oxide $M_2O$ of an alkali metal element M. In this manner, the sintering temperature can be further decreased. In general, a glass composition containing alkali metal ions exhibits a large dielectric loss and a small fQ value due to ionic induction. At an $M_2O$ content of 0.002 mol or less, the fQ value is rarely affected. At an $M_2O$ content of 0.0005 mol or more, the sintering temperature tends to decrease.

One or both of $Al_2O_3$ and $TiO_2$ in a total amount of 0.1 to 0.4 mol per mole of the total of $Ln_2O_3$ and $B_2O_3$ are contained as the filler. At a filler content less than 0.1 mol, excessive deformation may occur during sintering and the strength of the ceramic composition after the sintering may become insufficient. At a filler content exceeding 0.4 mol, the sintering temperature is increased, and it may be difficult to conduct low-temperature sintering at 1,000° C. or less. In order to increase the strength of the ceramic composition, $Al_2O_3$ may be singularly used or the content of $Al_2O_3$ may be increased. In order to increase the dielectric constant of the ceramic composition, $TiO_2$ may be singularly used or the content of $TiO_2$ may be increased.

There are mainly two methods as the method for producing the ceramic composition of the present invention. According to a first method, powders of starting materials for ceramic composition are prepared, and the powders are respectively weighed to yield a desired composition. The powders are wet-mixed in a ball mill, dried, and calcined at about 800° C. The resulting calcined material is pulverized to obtain a powder. A binder is added to the powder, and the resulting mixture is kneaded and formed into a desired shape to obtain a compact. The compact is heated to remove the binder and sintered to obtain the ceramic composition of the present invention.

According to a second method, powders of starting materials for the glass composition are prepared and respectively weighed to yield a desired composition. The powders are mixed with each other, and the resulting mixture is melted by heating at 1,000° C. or higher and rapidly cooled to produce a glass frit. The glass frit is pulverized. The filler was separately sintered and pulverized to prepare a powder. The glass frit, the filler, and the binder are mixed and kneaded, and formed into a compact. The binder is removed from the compact, and the resulting compact is sintered to prepare a ceramic composition of the present invention. In this second method, with respect to the glass frit containing $Al_2O_3$ and/or $TiO_2$ serving as the filler, it is possible to mix and knead the filler and the binder.

The above-described compact can be sintered at a temperature as low as 800° C. to 1,000° C. At a sintering temperature less than 800° C., the sintering of the ceramic composition may not be insufficient, and density is not satisfactory. Thus, satisfactory strength may not be exhibited. When the ceramic composition of the present invention is used as a material for a multilayer substrate and is sintered simultaneously with the material for metal wiring, the material for the metal wiring may be heated to a temperature higher than the melting point and may start to melt. However, at a temperature or 1,000° C. or less, the sintering can be performed without melting the material for the metal wiring, such as Cu or Ag. It should be noted that when Cu is used as the material for metal wiring, a reducing atmosphere is preferable to avoid possible oxidation, and when Ag is used as the material for metal wiring, the sintering temperature is preferably up to 930° C.

The above-described materials for the ceramic composition are not necessarily oxides as long as they are contained in the ceramic composition by forming oxides after the sintering. Thus, for example, carbonate salts, such as $CaCO_3$, and compounds, such as nitrides, e.g., BN, other than oxides may be used as the starting materials. Although these starting materials may contain impurities, they can be treated as single compounds as long as the impurity content is 5 mass % or less with respect to the mass of the respective compound and the same effects can be still be achieved.

In making a multilayer substrate having an integrated circuit by using the ceramic composition of the present invention, the material after kneading is first formed into sheets to prepare green sheets, and a conductive paste containing the material for metal wiring is applied on each green sheet by printing. A plurality of green sheets with the conductive paste applied thereon is stacked and sintered.

Here, a constraint sintering process in which the compact obtained by stacking a plurality of green sheets having the conductive paste applied thereon by printing is sintered while applying pressure or constraint in the vertical direction may be employed. According to this process, the contraction due to sintering is limited in the vertical direction, i.e., the Z direction, and no contraction occurs in the surface direction, i.e., the X-Y direction. A multilayer substrate having superior surface flatness can be accurately obtained as a result.

Preferably, green sheets composed of $Al_2O_3$ or the like that do not sinter at the sintering temperature of the ceramic composition are provided on the upper and lower surfaces, respectively, of the compact, and the compact is preferably sintered while applying pressure or constraint through these green sheets. Here, it is important that the $Al_2O_3$ green sheets on the upper and lower surfaces of the compact be easily separable and that the metal wiring after the sintering sufficiently adhere onto the ceramic composition so as to avoid conduction failure. Studies were conducted whether this process can be applied to the ceramic composition. The results confirmed that this process can be applied without any problem.

EXAMPLES

The starting material powders of the respective components were adequately weighed to give ceramic compositions having compositions shown in Tables 1 to 5. The starting material powders were all oxides. Deionized water was added to the starting material powders, and the resulting mixture was wet-mixed for 20 hours in a ball mill containing zirconia balls.

The resulting mixture was dried and calcined at 700° C. for 2 hours. The calcined mixture was pulverized to obtain a calcined powder. The calcined powder was combined with 10 mass % of a PVA aqueous solution serving as a binder, and the resulting mixture was kneaded, granulated, and press-formed into a compact having a diameter of 15 mm and a height of 7.5 mm. However, Samples 60, 61, and 62 shown in Table 3 were prepared by melting the materials excluding the filler by heating to 1,300° C., rapidly cooling the resulting materials to form a glass frit, adding a predetermined amount of the filler to the glass frit, adding 10 mass % of a PVA aqueous solution serving as a binder to the resulting mixture, kneading and granulating the resulting mixture, and press-forming the resulting mixture into a compact having a diameter of 15 mm and a height of 7.5 mm.

These press-formed compacts were used as the samples. The temperature at which an experimental sintered compact prepared by sintering in the temperature range of 800° C. to 1,250° C. is sufficiently dense is selected, and each sample was sintered at the corresponding selected temperature. Sintering of the sample was conducted after the sample was heated in air at 500° C. to 600° C. to remove the binder. The sintering of the sample was conducted by heating the sample at the above-described selected temperature for 2 hours.

The resulting cylindrical sinters were each polished to prepare a flat and smooth setter surface and then analyzed by a dielectric resonator method (short-circuited at both ends of a dielectric resonator) to determine the relative dielectric constant $\epsilon_r$ and the Q value ($Q=1/\tan \delta$). Since the dielectric loss varies depending on the measurement resonant frequency fo, the dielectric loss was evaluated in terms of the fQ value, which is a product of fo and Q and is a constant value dependent on the material of the sample but independent from the frequency. The temperature characteristic $\tau_f$ of the resonance frequency was determined from the rate of change in resonant frequency with varying temperature with reference to the resonant frequency fo at 25° C. The results of the measurement are shown in Tables 1 to 5.

TABLE 1

| | Composition of ceramic composition (molar ratio) | | | | | |
|---|---|---|---|---|---|---|
| Sample No. | $Ln_2O_3$ (Ln: Rare earth element) | $B_2O_3$ | RO (R: Alkaline earth metal element) | $WO_3$ | $M_2O$ (M: Alkali metal element) | Filler ($Al_2O_3$ or $TiO_2$) |
| 1 | $La_2O_3$: *0.1000 | *0.9000 | CaO: 0.0500 | 0.0100 | 0 | $Al_2O_3$: 0.2000 |
| 2 | $La_2O_3$: 0.1500 | 0.8500 | CaO: 0.0500 | 0.0100 | 0 | $Al_2O_3$: 0.2000 |
| 3 | $La_2O_3$: 0.2500 | 0.7500 | CaO: 0.0500 | 0.0100 | 0 | $Al_2O_3$: 0.2000 |
| 4 | $La_2O_3$: 0.3333 | 0.6667 | CaO: 0.0500 | 0.0100 | 0 | $Al_2O_3$: 0.2000 |
| 5 | $La_2O_3$: 0.4000 | 0.6000 | CaO: 0.0500 | 0.0100 | 0 | $Al_2O_3$: 0.2000 |
| 6 | $La_2O_3$: 0.5000 | 0.5000 | CaO: 0.0500 | 0.0100 | 0 | $Al_2O_3$: 0.2000 |
| 7 | $La_2O_3$: *0.6000 | *0.4000 | CaO: 0.0500 | 0.0100 | 0 | $Al_2O_3$: 0.2000 |
| 8 | $La_2O_3$: *0.6667 | *0.3333 | CaO: 0.0500 | 0.0100 | 0 | $Al_2O_3$: 0.2000 |
| 9 | $La_2O_3$: 0.2500 | 0.7500 | *0 | 0.0100 | 0 | $Al_2O_3$: 0.2000 |
| 10 | $La_2O_3$: 0.2500 | 0.7500 | CaO: 0.0100 | 0.0100 | 0 | $Al_2O_3$: 0.2000 |
| 11 | $La_2O_3$: 0.2500 | 0.7500 | CaO: 0.1000 | 0.0100 | 0 | $Al_2O_3$: 0.2000 |
| 12 | $La_2O_3$: 0.2500 | 0.7500 | CaO: 0.2000 | 0.0100 | 0 | $Al_2O_3$: 0.2000 |
| 13 | $La_2O_3$: 0.2500 | 0.7500 | CaO: *0.2500 | 0.0100 | 0 | $Al_2O_3$: 0.2000 |
| 14 | $La_2O_3$: 0.2500 | 0.7500 | CaO: 0.1000 | 0.0100 | 0 | $Al_2O_3$: 0.2000 |
| 15 | $La_2O_3$: 0.2500 | 0.7500 | CaO: 0.1000 | 0.0100 | 0 | $Al_2O_3$: 0.2000 |
| 16 | $La_2O_3$: 0.2500 | 0.7500 | CaO: 0.1000 | 0.0300 | 0 | $Al_2O_3$: 0.2000 |
| 17 | $La_2O_3$: 0.2500 | 0.7500 | CaO: 0.1000 | 0.0500 | 0 | $Al_2O_3$: 0.2000 |
| 18 | $La_2O_3$: 0.2500 | 0.7500 | CaO: 0.1000 | *0.0700 | 0 | $Al_2O_3$: 0.2000 |
| 19 | $La_2O_3$: 0.2500 | 0.7500 | CaO: 0.1000 | *0.1000 | 0 | $Al_2O_3$: 0.2000 |
| 20 | $La_2O_3$: 0.2500 | 0.7500 | CaO: 0.1000 | 0.0100 | 0 | $Al_2O_3$: 0.1000 |
| 21 | $La_2O_3$: 0.2500 | 0.7500 | CaO: 0.1000 | 0.0100 | 0 | $Al_2O_3$: 0.3000 |
| 22 | $La_2O_3$: 0.2500 | 0.7500 | CaO: 0.1000 | 0.0100 | 0 | $Al_2O_3$: 0.4000 |
| 23 | $La_2O_3$: 0.2500 | 0.7500 | CaO: 0.1000 | 0.0100 | 0 | $Al_2O_3$: 0.5500 |
| 24 | $La_2O_3$: 0.2500 | 0.7500 | CaO: 0.1000 | 0.0100 | 0 | $Al_2O_3$: 0.6000 |
| 25 | $La_2O_3$: 0.2500 | 0.7500 | CaO: 0.1000 | 0.0100 | 0 | $Al_2O_3$: 0.1000 |

| | Characteristics of ceramic composition | | | | | |
|---|---|---|---|---|---|---|
| Sample No. | Sintering temperature (° C.) | Relative dielectric constant $\epsilon_r$ | fQ (GHz) | Temperature characteristic $\tau_f$ (ppm/° C.) | Resonant frequency $f_0$ (GHz) | Remarks |
| 1 | 800 | 9.1 | 7500 | −41 | 13.5 | Comparative Example |
| 2 | 825 | 9.5 | 16500 | −36 | 13.2 | Invention Example |
| 3 | 850 | 10.1 | 15600 | −35 | 13.0 | Invention Example |
| 4 | 850 | 10.0 | 16000 | −20 | 12.0 | Invention Example |
| 5 | 900 | 11.0 | 17500 | −15 | 12.9 | Invention Example |
| 6 | 950 | 11.5 | 21000 | −17 | 12.7 | Invention Example |
| 7 | 1200 | 11.8 | 10200 | −25 | 12.4 | Comparative Example |
| 8 | 1250 | 10.3 | 15000 | −20 | 13.5 | Comparative Example |
| 9 | 1150 | 11.8 | 17000 | −25 | 12.0 | Comparative Example |
| 10 | 1000 | 11.5 | 17500 | −30 | 11.7 | Invention Example |
| 11 | 950 | 11.7 | 17200 | −37 | 11.2 | Invention Example |
| 12 | 900 | 11.4 | 16800 | −42 | 11.4 | Invention Example |
| 13 | 950 | 10.2 | 15800 | −73 | 13.1 | Comparative Example |
| 14 | 900 | 11.8 | 16800 | −31 | 11.4 | Invention Example |
| 15 | 900 | 10.0 | 17200 | −31 | 12.7 | Invention Example |

TABLE 1-continued

| | | | | | | |
|---|---|---|---|---|---|---|
| 16 | 850 | 10.2 | 18500 | −35 | 12.4 | Invention Example |
| 17 | 850 | 10.1 | 17500 | −39 | 12.8 | Invention Example |
| 18 | 850 | 9.8 | 7200 | −59 | 13.1 | Comparative Example |
| 19 | 850 | 9.8 | 4300 | −70 | 13.1 | Comparative Example |
| 20 | 850 | 9.2 | 17400 | −32 | 12.2 | Invention Example |
| 21 | 900 | 9.1 | 18000 | −37 | 13.0 | Invention Example |
| 22 | 950 | 8.5 | 18100 | −38 | 13.9 | Invention Example |
| 23 | 1100 | 7.8 | 12000 | −29 | 14.0 | Comparative Example |
| 24 | 1150 | 7.1 | 9500 | −13 | 14.1 | Comparative Example |
| 25 | 910 | 10.0 | 16500 | −31 | 12.1 | Invention Example |

Asterisks indicate that the marked features are outside the scope of the present invention.

TABLE 2

| | Composition of ceramic composition (molar ratio) | | | | | |
|---|---|---|---|---|---|---|
| Sample No. | $Ln_2O_3$ (Ln: Rare earth element) | $B_2O_3$ | RO (R: Alkaline earth metal element) | $WO_3$ | $M_2O$ (M: Alkali metal element) | Filler ($Al_2O_3$ or $TiO_2$) |
| 26 | $La_2O_3$: 0.2500 | 0.7500 | CaO: 0.1000 | 0.0100 | 0 | $TiO_2$: 0.3000 |
| 27 | $La_2O_3$: 0.2500 | 0.7500 | CaO: 0.1000 | 0.0100 | 0 | $TiO_2$: 0.4000 |
| 28 | $La_2O_3$: 0.2500 | 0.7500 | CaO: 0.1000 | 0.0100 | 0 | $TiO_2$: *0.5000 |
| 29 | $Nd_2O_3$: *0.1000 | *0.9000 | CaO: 0.1000 | 0 | 0 | $Al_2O_3$: 0.1500 |
| 30 | $Nd_2O_3$: 0.1500 | 0.8500 | CaO: 0.1000 | 0 | 0 | $Al_2O_3$: 0.1500 |
| 31 | $Nd_2O_3$: 0.2500 | 0.7500 | CaO: 0.1000 | 0 | 0 | $Al_2O_3$: 0.1500 |
| 32 | $Nd_2O_3$: 0.3300 | 0.6700 | CaO: 0.1000 | 0 | 0 | $Al_2O_3$: 0.1500 |
| 33 | $Nd_2O_3$: 0.4000 | 0.6000 | CaO: 0.1000 | 0 | 0 | $Al_2O_3$: 0.1500 |
| 34 | $Nd_2O_3$: 0.5000 | 0.5000 | CaO: 0.1000 | 0 | 0 | $Al_2O_3$: 0.1500 |
| 35 | $Nd_2O_3$: 0.5500 | 0.4500 | CaO: 0.1000 | 0 | 0 | $Al_2O_3$: 0.1500 |
| 36 | $Nd_2O_3$: *0.6000 | *0.4000 | CaO: 0.1000 | 0 | 0 | $Al_2O_3$: 0.1500 |
| 37 | $La_2O_3$: 0.1000 $Nd_2O_3$: 0.1000 | 0.8000 | CaO: 0.1000 | 0 | 0 | $Al_2O_3$: 0.1500 |
| 38 | $La_2O_3$: 0.2000 $Nd_2O_3$: 0.2000 | 0.6000 | CaO: 0.1000 | 0 | 0 | $Al_2O_3$: 0.1500 |
| 39 | $La_2O_3$: 0.3000 $Nd_2O_3$: 0.2000 | 0.5000 | CaO: 0.1000 | 0 | 0 | $Al_2O_3$: 0.1500 |
| 40 | $La_2O_3$: 0.3000 $Nd_2O_3$: 0.2000 | 0.5000 | CaO: 0.1000 | 0 | 0 | $Al_2O_3$: 0.1500 |
| 41 | $La_2O_3$: *0.3000 $Nd_2O_3$: *0.3000 | *0.4000 | CaO: 0.1000 | 0 | 0 | $Al_2O_3$: 0.1500 |
| 42 | $La_2O_3$: 0.3333 | 0.6667 | BaO: 0.1000 | 0 | 0 | $Al_2O_3$: 0.1500 |
| 43 | $La_2O_3$: 0.3333 | 0.6667 | BaO: 0.1000 | 0 | 0 | $Al_2O_3$: 0.1500 |
| 44 | $La_2O_3$: 0.3333 | 0.6667 | BaO: *0.2500 | 0 | 0 | $Al_2O_3$: 0.1500 |
| 45 | $La_2O_3$: 0.3333 | 0.6667 | SrO: 0.0100 | 0 | 0 | $Al_2O_3$: 0.1500 |

| | Characteristics of ceramic composition | | | | | |
|---|---|---|---|---|---|---|
| Sample No. | Sintering temperature (° C.) | Relative dielectric constant $\epsilon_r$ | fQ (GHz) | Temperature characteristic $\tau_f$ (ppm/° C.) | Resonant frequency $f_0$ (GHz) | Remarks |
| 26 | 915 | 12.1 | 17200 | −25 | 12.4 | Invention Example |
| 27 | 950 | 14.1 | 15000 | −20 | 11.8 | Invention Example |
| 28 | 1125 | 14.3 | 9300 | −25 | 11.1 | Comparative Example |
| 29 | 850 | 9.3 | 7200 | −36 | 13.8 | Comparative Example |
| 30 | 900 | 10.2 | 16800 | −39 | 12.4 | Invention Example |
| 31 | 925 | 10.8 | 17500 | −30 | 12.1 | Invention Example |
| 32 | 925 | 11.0 | 16000 | −25 | 11.0 | Invention Example |
| 33 | 950 | 12.0 | 18000 | −20 | 11.2 | Invention Example |
| 34 | 950 | 11.8 | 17500 | −15 | 11.5 | Invention Example |
| 35 | 950 | 11.5 | 15200 | −14 | 11.7 | Invention Example |
| 36 | 1050 | 10.1 | 11300 | −21 | 10.9 | Comparative Example |
| 37 | 900 | 10.5 | 17500 | −30 | 12.2 | Invention Example |
| 38 | 950 | 11.8 | 18000 | −18 | 11.9 | Invention Example |
| 39 | 900 | 11.7 | 17000 | −14 | 11.6 | Invention Example |
| 40 | 900 | 11.8 | 18000 | −13 | 11.5 | Invention Example |
| 41 | 1025 | 9.8 | 6300 | −21 | 14.3 | Comparative Example |
| 42 | 950 | 10.6 | 15600 | −35 | 10.1 | Invention Example |
| 43 | 1000 | 11.0 | 15000 | −45 | 11.0 | Invention Example |
| 44 | 950 | 11.5 | 16200 | −71 | 11.1 | Comparative Example |
| 45 | 1000 | 9.9 | 15000 | −38 | 10.2 | Invention Example |

Asterisks indicate that the marked features are outside the scope of the present invention.

TABLE 3

| | Composition of ceramic composition (molar ratio) | | | | | |
|---|---|---|---|---|---|---|
| Sample No. | Ln$_2$O$_3$ (Ln: Rare earth element) | B$_2$O$_3$ | RO (R: Alkaline earth metal element) | WO$_3$ | M$_2$O (M: Alkali metal element) | Filler (Al$_2$O$_3$ or TiO$_2$) |
| 46 | La$_2$O$_3$: 0.3333 | 0.6667 | SrO: 0.1000 | 0 | 0 | Al$_2$O$_3$: 0.1500 |
| 47 | La$_2$O$_3$: 0.3333 | 0.6667 | SrO: *0.2500 | 0 | 0 | Al$_2$O$_3$: 0.1500 |
| 48 | La$_2$O$_3$: 0.3333 | 0.6667 | CaO: 0.0500 BaO: 0.0100 | 0 | 0 | Al$_2$O$_3$: 0.1500 |
| 49 | La$_2$O$_3$: 0.3333 | 0.6667 | CaO: 0.1000 BaO: 0.0500 | 0 | 0 | Al$_2$O$_3$: 0.1500 |
| 50 | La$_2$O$_3$: 0.3333 | 0.6667 | CaO: 0.1000 SrO: 0.0500 | 0 | 0 | Al$_2$O$_3$: 0.1500 |
| 51 | La$_2$O$_3$: 0.3333 | 0.6667 | BaO: 0.0100 SrO: 0.0500 | 0 | 0 | Al$_2$O$_3$: 0.1500 |
| 52 | La$_2$O$_3$: 0.2500 | 0.7500 | CaO: 0.1000 | 0 | Li$_2$O: 0.0010 | Al$_2$O$_3$: 0.1500 |
| 53 | La$_2$O$_3$: 0.2500 | 0.7500 | CaO: 0.1000 | 0 | Li$_2$O: 0.0020 | Al$_2$O$_3$: 0.1500 |
| 54 | La$_2$O$_3$: 0.2500 | 0.7500 | CaO: 0.1000 | 0 | Li$_2$O: *0.0025 | Al$_2$O$_3$: 0.1500 |
| 55 | La$_2$O$_3$: 0.2500 | 0.7500 | BaO: 0.0100 | 0 | Li$_2$O: 0.0010 | Al$_2$O$_3$: 0.1500 |
| 56 | La$_2$O$_3$: 0.3333 | 0.6667 | SrO: 0.1000 | 0 | Li$_2$O: 0.0010 | Al$_2$O$_3$: 0.1500 |
| 57 | La$_2$O$_3$: 0.3333 | 0.6667 | CaO: 0.1000 | 0 | Na$_2$O: 0.0010 | Al$_2$O$_3$: 0.1500 |
| 58 | La$_2$O$_3$: 0.3333 | 0.6667 | CaO: 0.1000 | 0 | Na$_2$O: 0.0020 | Al$_2$O$_3$: 0.1500 |
| 59 | La$_2$O$_3$: 0.3333 | 0.6667 | CaO: 0.1000 | 0 | Na$_2$O: *0.0025 | Al$_2$O$_3$: 0.1500 |
| 60 | La$_2$O$_3$: 0.3333 | 0.6667 | CaO: 0.1000 | 0 | Li$_2$O: 0.0010 Na$_2$O: 0.0010 | Al$_2$O$_3$: 0.1500 |
| 61 | La$_2$O$_3$: 0.3333 | 0.6667 | CaO: 0.1000 | 0 | Li$_2$O: 0.0010 K$_2$O: 0.0010 | Al$_2$O$_3$: 0.1500 |
| 62 | La$_2$O$_3$: 0.3333 | 0.6667 | CaO: 0.1000 | 0 | K$_2$O: 0.0010 Na$_2$O: 0.0010 | Al$_2$O$_3$: 0.1500 |

| | Characteristics of ceramic composition | | | | | |
|---|---|---|---|---|---|---|
| Sample No. | Sintering temperature (°C.) | Relative dielectric constant $\epsilon_r$ | fQ (GHz) | Temperature characteristic $\tau_f$ (ppm/°C.) | Resonant frequency $f_0$ (GHz) | Remarks |
| 46 | 1000 | 10.2 | 15000 | −35 | 10.2 | Invention Example |
| 47 | 950 | 10.8 | 12500 | −70 | 10.2 | Comparative Example |
| 48 | 980 | 11.0 | 15200 | −45 | 10.2 | Invention Example |
| 49 | 980 | 11.5 | 15000 | −38 | 9.8 | Invention Example |
| 50 | 950 | 10.2 | 15000 | −35 | 10.0 | Invention Example |
| 51 | 980 | 11.5 | 15000 | −40 | 10.1 | Invention Example |
| 52 | 900 | 11.7 | 14500 | −38 | 9.8 | Invention Example |
| 53 | 850 | 9.8 | 15500 | −40 | 8.0 | Invention Example |
| 54 | 800 | 6.8 | <2000 | Immeasurable | 7.8 | Comparative Example |
| 55 | 900 | 12.0 | 15100 | −35 | 10.1 | Invention Example |
| 56 | 850 | 11.0 | 15300 | −39 | 10.5 | Invention Example |
| 57 | 850 | 10.2 | 15000 | −35 | 11.3 | Invention Example |
| 58 | 800 | 8.0 | 15100 | −36 | 12.1 | Invention Example |
| 59 | 800 | 5.0 | <2000 | Immeasurable | 15.8 | Comparative Example |
| 60 | **800 | 8.5 | 16100 | −38 | 11.8 | Invention Example |
| 61 | **825 | 8.8 | 15000 | −40 | 11.6 | Invention Example |
| 62 | **825 | 9.0 | 15500 | −38 | 11.3 | Invention Example |

Asterisks indicate that the marked features are outside the scope of the present invention.
Double asterisks indicate that the filler was mixed after preparation of the glass frit, and the resulting mixture was then sintered.

TABLE 4

| | Composition of ceramic composition (molar ratio) | | | | | |
|---|---|---|---|---|---|---|
| Sample No. | Ln$_2$O$_3$ (Ln: Rare earth element) | B$_2$O$_3$ | RO (R: Alkaline earth metal element) | WO$_3$ | M$_2$O (M: Alkali metal element) | Filler (Al$_2$O$_3$ or TiO$_2$) |
| 63 | La$_2$O$_3$: 0.3333 | 0.6667 | CaO: 0.1000 | 0 | Rb$_2$O: 0.0010 | Al$_2$O$_3$: 0.1500 |
| 64 | La$_2$O$_3$: 0.3333 | 0.6667 | CaO: 0.1000 | 0 | Cs$_2$O: 0.0010 | Al$_2$O$_3$: 0.1500 |
| 65 | La$_2$O$_3$: 0.3333 | 0.6667 | CaO: 0.1000 | 0.0100 | Li$_2$O: 0.0010 | Al$_2$O$_3$: 0.1500 |
| 66 | La$_2$O$_3$: 0.3333 | 0.6667 | CaO: 0.1000 | 0.0300 | Li$_2$O: 0.0010 | Al$_2$O$_3$: 0.1500 |
| 67 | La$_2$O$_3$: 0.3333 | 0.6667 | CaO: 0.1000 | 0.0500 | Li$_2$O: 0.0010 | Al$_2$O$_3$: 0.1500 |
| 68 | La$_2$O$_3$: 0.3333 | 0.6667 | CaO: 0.1000 | *0.0600 | Li$_2$O: 0.0010 | Al$_2$O$_3$: 0.1500 |
| 69 | Nd$_2$O$_3$: 0.3333 | 0.6667 | CaO: 0.1000 | 0.0300 | Li$_2$O: 0.0010 | Al$_2$O$_3$: 0.1500 |
| 70 | Nd$_2$O$_3$: 0.3333 | 0.6667 | CaO: 0.1000 | 0.0500 | Li$_2$O: 0.0010 | Al$_2$O$_3$: 0.1500 |
| 71 | Nd$_2$O$_3$: 0.3333 | 0.6667 | CaO: 0.1000 | *0.0600 | Li$_2$O: 0.0010 | Al$_2$O$_3$: 0.2000 |

TABLE 4-continued

| | | | | | | | | |
|---|---|---|---|---|---|---|---|---|
| 72 | La₂O₃: 0.2500 | | 0.7500 | CaO: 0.1000 | | 0.0100 | Li₂O: 0.0010 | Al₂O₃: 0.1000<br>TiO₂: 0.1000 |
| 73 | La₂O₃: 0.2500 | | 0.7500 | CaO: 0.1000 | | 0.0100 | Li₂O: 0.0010 | Al₂O₃: 0.2000<br>TiO₂: 0.1000 |
| 74 | La₂O₃: 0.2500 | | 0.7500 | CaO: 0.1000 | | 0.0100 | Li₂O: 0.0010 | Al₂O₃: 0.2500<br>TiO₂: 0.2500 |
| 75 | Nd₂O₃: 0.2500 | | 0.7500 | CaO: 0.0500<br>BaO: 0.0500 | | 0.0100 | Li₂O: 0.0010 | Al₂O₃: 0.2000 |
| 76 | La₂O₃: 0.2000<br>Nd₂O₃: 0.2000 | | 0.6000 | CaO: 0.1000<br>BaO: 0.0500 | | 0.0100 | Li₂O: 0.0010<br>Na₂O: 0.0010 | Al₂O₃: 0.1000<br>TiO₂: 0.1000 |
| 77 | La₂O₃: 0.1500<br>Nd₂O₃: 0.1500 | | 0.7000 | CaO: 0.1000<br>BaO: 0.0500 | | 0.0100 | Li₂O: 0.0010 | Al₂O₃: 0.3000 |
| 78 | La₂O₃: 0.2000<br>Nd₂O₃: 0.1333 | | 0.6667 | CaO: 0.1000 | | 0.0100 | Li₂O: 0.0010 | Al₂O₃: 0.1000 |
| 79 | La₂O₃: 0.2333<br>Nd₂O₃: 0.1000 | | 0.6667 | CaO: 0.1000 | | 0.0100 | Li₂O: 0.0010 | Al₂O₃: 0.1000 |

| | Characteristics of ceramic composition | | | | | |
|---|---|---|---|---|---|---|
| Sample No. | Sintering temperature (° C.) | Relative dielectric constant $\varepsilon_r$ | fQ (GHz) | Temperature characteristic $\tau_f$ (ppm/° C.) | Resonant frequency $f_0$ (GHz) | Remarks |
| 63 | 850 | 8.7 | 15000 | −35 | 12.1 | Invention Example |
| 64 | 850 | 8.5 | 15000 | −33 | 13.0 | Invention Example |
| 65 | 850 | 10.2 | 16000 | −40 | 12.0 | Invention Example |
| 66 | 850 | 7.8 | 15500 | −45 | 13.8 | Invention Example |
| 67 | 850 | 7.0 | 15000 | −49 | 13.5 | Invention Example |
| 68 | 800 | 6.8 | 9500 | −65 | 14.0 | Comparative Example |
| 69 | 850 | 7.5 | 16000 | −41 | 13.8 | Invention Example |
| 70 | 800 | 6.8 | 15000 | −48 | 13.3 | Invention Example |
| 71 | 800 | 6.3 | 6300 | −68 | 14.3 | Comparative Example |
| 72 | 950 | 11.3 | 16800 | −33 | 10.8 | Invention Example |
| 73 | 1000 | 13.1 | 17200 | −35 | 10.2 | Invention Example |
| 74 | 1150 | 13.8 | 16000 | −38 | 10.0 | Comparative Example |
| 75 | 1000 | 12.1 | 16000 | −30 | 10.5 | Invention Example |
| 76 | 900 | 11.8 | 15800 | −25 | 11.0 | Invention Example |
| 77 | 950 | 9.5 | 15000 | −30 | 12.1 | Invention Example |
| 78 | 900 | 10.0 | 15500 | −35 | 10.8 | Invention Example |
| 79 | 900 | 10.5 | 15000 | −40 | 11.5 | Invention Example |

Asterisks indicate that the marked features are outside the scope of the present invention.

TABLE 5

| | Composition of ceramic composition (molar ratio) | | | | | | |
|---|---|---|---|---|---|---|---|
| Sample No. | Ln₂O₃ (Ln: Rare earth element) | B₂O₃ | RO (R: Alkaline earth metal element) | WO₃ | M₂O (M: Alkali metal element) | Filler (Al₂O₃ or TiO₂) |
| 80 | La₂O₃: 0.3333 | 0.6667 | CaO: 0.0500<br>BaO: 0.0500 | 0.0100 | Li₂O: 0.0010<br>Na₂O: 0.0010 | Al₂O₃: 0.1000 |
| 81 | La₂O₃: 0.2500 | 0.7500 | CaO: 0.1000<br>SrO: 0.1000 | 0.0100 | Li₂O: 0.0010 | Al₂O₃: 0.1000 |
| 82 | La₂O₃: 0.2500 | 0.7500 | CaO: 0.1000 | 0.0100 | Li₂O: 0.0020 | Al₂O₃: 0.1000 |
| 83 | La₂O₃: 0.3333 | 0.6667 | CaO: 0.1000 | 0.0100 | Li₂O: 0.0010 | Al₂O₃: 0.2000<br>TiO₂: 0.2000 |
| 84 | La₂O₃: 0.3333 | 0.6667 | CaO: 0.1000 | 0.0100 | Li₂O: 0.0010 | Al₂O₃: *0.3000<br>TiO₂: *0.3000 |
| 85 | Nd₂O₃: 0.2500 | 0.7500 | CaO: 0.1000 | 0.0100 | Li₂O: 0.0010 | Al₂O₃: 0.3000 |
| 86 | Nd₂O₃: 0.3333 | 0.6667 | CaO: 0.1000 | 0.0100 | Li₂O: 0.0010 | Al₂O₃: 0.4000 |
| 87 | Nd₂O₃: 0.5000 | 0.5000 | CaO: 0.1000 | 0.0100 | Li₂O: 0.0010 | Al₂O₃: 0.3000 |
| 88 | Nd₂O₃: 0.5000 | 0.5000 | CaO: 0.1000 | 0.0100 | Li₂O: 0.0010<br>K₂O: 0.0010 | Al₂O₃: 0.3000 |
| 89 | Nd₂O₃: 0.5000 | 0.5000 | CaO: 0.1000<br>BaO: 0.1000 | 0.0100 | Li₂O: 0.0010 | Al₂O₃: 0.3000 |
| 90 | Nd₂O₃: 0.5000 | 0.5000 | CaO: 0.1000<br>BaO: 0.1000 | 0.0200 | Li₂O: 0.0010 | Al₂O₃: 0.3000 |
| 91 | La₂O₃: 0.2500<br>Nd₂O₃: 0.2500 | 0.5000 | CaO: 0.1000<br>BaO: 0.1000 | 0.0500 | Li₂O: 0.0010 | Al₂O₃: 0.3000 |
| 92 | La₂O₃: 0.3000<br>Nd₂O₃: 0.2500 | 0.4500 | CaO: 0.1000<br>BaO: 0.1000 | 0.0100 | Li₂O: 0.0010 | Al₂O₃: 0.3000 |

TABLE 5-continued

| | | Characteristics of ceramic composition | | | | |
|---|---|---|---|---|---|---|
| Sample No. | Sintering temperature (° C.) | Relative dielectric constant $\epsilon_r$ | fQ (GHz) | Temperature characteristic $\tau_f$ (ppm/° C.) | Resonant frequency $f_0$ (GHz) | Remarks |
| 80 | 850 | 8.5 | 17500 | −38 | 14.0 | Invention Example |
| 81 | 850 | 10.3 | 16500 | −35 | 12.5 | Invention Example |
| 82 | 850 | 10.2 | 16500 | −36 | 12.5 | Invention Example |
| 83 | 1000 | 11.5 | 17000 | −30 | 10.5 | Invention Example |
| 84 | 1150 | 10.8 | 7400 | −35 | 12.2 | Comparative Example |
| 85 | 1000 | 11.0 | 15000 | −33 | 11.8 | Invention Example |
| 86 | 1000 | 11.2 | 16000 | −38 | 11.2 | Invention Example |
| 87 | 1000 | 11.1 | 15800 | −35 | 11.8 | Invention Example |
| 88 | 980 | 12.1 | 15000 | −30 | 9.7 | Invention Example |
| 89 | 950 | 11.8 | 16500 | −40 | 11.5 | Invention Example |
| 90 | 950 | 10.5 | 15500 | −41 | 12.0 | Invention Example |
| 91 | 900 | 10.3 | 15000 | −38 | 11.5 | Invention Example |
| 92 | 1000 | 10.4 | 15500 | −40 | 10.3 | Invention Example |

Asterisks indicate that the marked features are outside the scope of the present invention.

The results shown in Table 1 to 5 show that nearly all of the invention examples exhibited an fQ value of 15,000 GHz or more, a low dielectric loss in the high-frequency band, and a resonant frequency temperature coefficient $\tau_f$ of within ±50° C./ppm. This is presumably due to the effect of incorporating $Ln_2O_3$ into the glass composition together with the filler. At a small $Ln_2O_3$ content, the fQ value is low, as shown by Samples 1 in Table 1 and Sample 29 in Table 2.

The invention examples produced sufficiently dense sinters having high fQ values even at a sintering temperature of 1,000° C. or less. This is because the contents of the $Ln_2O_3$, RO, $Al_2O_3$, and $TiO_2$ are limited within particular ranges. This fact is clearly supported by the results of Samples 7, 8, 9, 23, 24, 28, 36, 41, 47, 74, and 84 compositions which were outside the ranges of the invention, since they did not achieve the target fQ value or they required high sintering temperatures.

RO has an effect of decreasing the sintering temperature. However, at an excessively large RO content, the temperature coefficient $\tau_f$ of the resonant frequency tends to be excessively shifted toward the negative side, as shown by Samples 13, 44, and 47.

Incorporation of $WO_3$ or $M_2O$ decreases the sintering temperature, and $WO_3$ or $M_2O$ can be effectively used by controlling its content. At an excessively large content, however, a significant decrease in fQ value or degradation of temperature coefficient $\tau_f$ may result, as shown by Samples 18, 19, 54, 59, 68, and 71.

INDUSTRIAL APPLICABILITY

A ceramic composition of the present invention has a low dielectric loss in the high-frequency band and low temperature dependence of the resonant frequency. Moreover, since its characteristics can be exhibited at a low sintering temperature, a metal, such as Ag or Cu, having a low specific resistance can be used as the material for the metal wiring or electrode, and the conductor loss can thus be decreased. The ceramic composition of the present invention is thus suitable for the substrate materials for high-frequency band multilayer substrates and the materials for electronic components.

The invention claimed is:

1. A ceramic composition comprising a glass composition and 0.1 to 0.4 mol of a filler which is at least one of $Al_2O_3$ and $TiO_2$, wherein the composition of the glass composition comprises 0.15 to 0.55 mol of a which is an oxide or oxide precursor of a rare earth element or mixtures thereof, 0.45 to 0.85 mol of b which is boron oxide $B_2O_3$ or an oxide precursor thereof, wherein a+b=1 mol, and 0.01 to 0.2 mol of an oxide or oxide precursor of an alkaline earth metal element.

2. The ceramic composition according to claim 1, comprising a positive amount of up to 0.05 mol of tungsten oxide or an oxide precursor thereof.

3. The ceramic composition according to claim 2 in which the amount of tungsten oxide or precursor is at least 0.005 mol.

4. The ceramic composition according to claim 3, comprising 0.0005 to 0.002 mol of an oxide or oxide precursor of an alkali metal element M.

5. The ceramic composition according to claim 2, comprising 0.0005 to 0.002 mol of an oxide or oxide precursor of an alkali metal element M.

6. The ceramic composition according to claim 1 which contains 0.0005 to 0.002 mol of an oxide or oxide precursor of an alkali metal.

7. The ceramic composition according to claim 1 in which the rare earth element is at least one of La and Nd.

8. The ceramic composition according to claim 1 in which the alkaline earth metal comprises Ca.

9. The ceramic composition according to claim 1 in which the filler comprises $Al_2O_3$.

10. The ceramic composition according to claim 1 in which the filler comprises $TiO_2$.

11. The ceramic composition according to claim 1 in which each of the oxides or precursors is the oxide.

12. The ceramic composition according to claim 11, comprising a positive amount of up to 0.05 mol of tungsten oxide.

13. The ceramic composition according to claim 12, comprising 0.0005 to 0.002 mol of an oxide of an alkali metal element, and in which the rare earth element is at least one of La and Nd, and the alkaline earth metal comprises Ca.

14. The ceramic composition according to claim 13 in which the filler comprises $Al_2O_3$.

15. The ceramic composition according to claim 14, in which the tungsten oxide amount is 0.005 to 0.05 mol.

16. The ceramic composition according to claim 13 in which the filler comprises $TiO_2$.

17. A compact comprising a sintered composition of claim 16.

18. A compact comprising a sintered composition of claim 14.

19. A compact comprising a sintered composition of claim 10.

20. A compact comprising a sintered composition of claim 9.

21. A compact comprising a sintered composition of claim 1.

* * * * *